(12) United States Patent
Kandaka et al.

(10) Patent No.: US 6,339,634 B1
(45) Date of Patent: Jan. 15, 2002

(54) SOFT X-RAY LIGHT SOURCE DEVICE

(75) Inventors: Noriaki Kandaka, Kanagawa; Hiroyuki Kondo, Ibaraki; Soichi Owa; Tomoko Ohtsuki, both of Tokyo, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/409,063

(22) Filed: Sep. 30, 1999

(30) Foreign Application Priority Data

Oct. 1, 1998 (JP) .......................... 10-279699
Jul. 26, 1999 (JP) .......................... 11-210615

(51) Int. Cl.⁷ .............................................. H01J 35/26
(52) U.S. Cl. ........................................ 378/119; 378/143
(58) Field of Search ................................ 378/119, 120, 378/121, 143; 372/5

(56) References Cited

U.S. PATENT DOCUMENTS 5,016,250 A * 5/1991 Rosen et al. ................... 372/5
5,293,396 A * 3/1994 Tomie ............................ 372/5
5,577,092 A * 11/1996 Keblak et al. ............... 378/119

FOREIGN PATENT DOCUMENTS

JP    11-312638    11/1999

* cited by examiner

*Primary Examiner*—David P. Porta
(74) *Attorney, Agent, or Firm*—Morgan, Lewis & Bockius LLP

(57) ABSTRACT

A high-pressure krypton gas is supplied to the interior of a vessel from a gas introduction pipe. Light emitted from an optical fiber group formed by bundling together optical fibers constituting the output ends of fiber amplifiers or fiber lasers passes through a lens and exciting laser light introduction window, and is focused on the krypton gas jetting from the tip end of the nozzle. As a result, the krypton gas is excited as a plasma and soft X-rays are generated. The soft X-rays are reflected by a rotating multi-layer coat parabolic mirror and are emitted to the outside as a parallel beam of soft X-rays. Since light from fiber amplifiers is used as exciting light, and since numerous optical fibers are bundled together to form a light source, a large quantity of soft X-rays can easily be obtained.

31 Claims, 8 Drawing Sheets

SOFT X-RAY LIGHT SOURCE DEVICE

BACKGROUND OF THE INVENTION

1. Field of the Invention

The present invention relates to a soft X-ray generating apparatus and a soft X-ray lithography apparatus using this soft X-ray generating apparatus. More specifically, the present invention concerns a soft X-ray generating apparatus that can generate a large quantity of soft X-rays, and a soft X-ray lithography apparatus using this soft X-ray generating apparatus.

2. Discussion of the Related Art

Conventionally, in exposure equipment used in semiconductor manufacture, equipment with an exposure and transfer system has been widely used in which a photo-mask (hereafter referred to as a "mask") is irradiated by means of an irradiation optical system so that circuit patterns formed on the mask surface are projected and transferred onto a substrate such as a wafer, etc., via an image-focusing device. The substrate is coated with a resist, and the resist becomes photosensitive as a result of being exposed so that a resist pattern is obtained.

The resolving power w of an exposure apparatus is determined mainly by the exposure wavelength $\lambda$ and the numerical aperture NA of the image-focusing optical system, and is expressed by the following equation:

$$w = k\lambda/NA \quad (1)$$

k: constant

Meanwhile, the focal depth DF is determined by the following equation:

$$DF = \lambda/2(NA)^2 \quad (2)$$

As is clear from Equation (1), it is necessary to reduce the constant k, increase the numerical aperture NA, or reduce the wavelength $\lambda$ of the light source in order to reduce the dimensions of the minimum pattern that can be exposed.

K is a constant that is determined by the projection optical system and process, and ordinarily has a value of approximately 0.5 to 0.8. Methods for reducing this constant k are referred to as super-resolution in a broad sense. In the past, methods such as improvement of the projection optical system, deformed illumination and phase shift mask methods, etc., have been proposed; however, there are difficulties in terms of the patterns that can be used, so that the range of application of such methods is limited. Meanwhile, as is clear from Equation (1), the minimum pattern dimensions can be reduced if the numerical aperture, NA, is increased. At the same time, however, as is clear from Equation (2), this leads to the problem of a reduced focal depth. Accordingly, there are limits to the extent to which the NA value can be increased, and a value of approximately 0.5 to 0.6 is ordinarily appropriate.

Accordingly, the most effective method of reducing the minimum pattern dimensions is to shorten the wavelength $\lambda$ of the light used for exposure, and to simultaneously reduce the NA as well, since shortening the exposure wavelength alone will reduce the focal depth.

Currently, in the manufacture of semiconductor integrated circuits, a method is widely used in which an extremely fine pattern formed on a mask is projected in a reduced form and transferred onto a silicon wafer (coated with a resist) by means of visible light or ultraviolet light. However, as pattern sizes become finer, the diffraction limit is being approached even in the case of ultraviolet light, so that reduction and projection type exposure using soft X-rays with wavelengths even shorter than those of ultraviolet light, i. e., wavelengths of 13 nm or 11 nm, has been proposed.

In cases where soft X-rays with a wavelength of 13 nm or 11 nm are used, one conceivable candidate for the light source (soft X-ray source) used is a laser plasma X-ray source (hereafter referred to as "LPX"). When pulsed light emitted from a laser device is focused and directed onto a substance, if the irradiation intensity exceeds $10^{10}$ W/cm$^2$, electrons are stripped from the atoms of the substance by the intense electric field so that the substance is converted into a plasma, and soft X-rays are radiated from this plasma. The brightness of the soft X-rays radiated from this plasma is extremely high, and a large quantity of soft X-rays can be obtained by generating the plasma at a high repetition rate. Furthermore, an LPX is extremely compact as an apparatus compared to synchrotron radiation facility, etc. Accordingly, LPXs show great promise, not only in the area of soft X-ray lithography, but also as radiation sources for X-ray microscopes and analysis devices, etc.

In cases where an LPX is used in soft X-ray lithography, the quantity of soft X-rays obtained from the light source is important. Since soft X-rays are strongly absorbed by all substances, ordinary lenses and reflective mirrors cannot be used. Accordingly, in order to obtain a high throughput in soft X-ray lithography, optical systems are constructed from reflective mirrors in which a multi-layer film is formed on the reflective surface. There is an intimate relationship between the combination of substances making up such a multi-layer film and the wavelengths reflected by the multi-layer film. In the case of an Mo/Si multi-layer film, a high reflectivity is obtained in the vicinity of a wavelength of 13 nm, while in the case of an Mo/Be multi-layer film, a high reflectivity is obtained in the vicinity of 11 nm. Accordingly, these wavelengths may be cited as candidates for the wavelengths used in soft X-ray lithography. However, even in the case of reflective surfaces formed using such multi-layer films, the limit of the reflectivity obtained for soft X-rays is approximately 70%. Assuming that approximately 10 reflective surfaces are used for reduction and projection type exposure, the transmissivity (reflectivity) of the optical system as a whole is extremely low, i. e., a few percent. Accordingly, in order to obtain a sufficient treatment speed (throughput) for a projection exposure apparatus, it is desirable that the quantity of soft X-rays generated by the light source be as large as possible.

In the case of an LPX using clusters formed by causing a gas to jet into a vacuum vessel as a target material, it is reported that the efficiency of conversion to a wavelength region of 13 nm or 11 nm (2.5% BW) is approximately 1 to 2%. The development of an LD-excited solid laser, which has an output of 1.5 kW as an exciting laser light source, has been promoted in order to obtain a sufficient throughput at this conversion efficiency. In the case of soft X-ray lithography, a method in which an annular band-form region is scanned is used in order to obtain a broad exposure area. When such scanning is performed, it is desirable that a continuous light source with a stable intensity be used in order to prevent the occurrence of irregularities in brightness within the exposure region. However, even in the case of an LPX, which is a pulsed light source, there is no problem if the repetition rate is on the order of kHz.

However, in order to increase the output of a conventional solid laser so that an output of 1 kW or greater is obtained, it is necessary to have a repetition rate on the order of kHz, and to increase the energy of one pulse to a high value. The development of such laser devices is currently being pursued; however, the development of a laser device which has such a large output, and which can operate stably over a long period of time, is not easy. Furthermore, even if such a laser device is developed, the resulting device would be extremely expensive.

Accordingly, there is a demand for a soft X-ray generating apparatus, which produces an output exceeding 1 kW, which is easy to manufacture, and which is equipped with an inexpensive pulsed laser light-generating device as an exciting pulsed light source, for use as an exciting light source that excites the laser plasma used in a soft X-ray lithography apparatus.

In cases where an LPX is used in a soft X-ray lithography apparatus, several optical systems for the purpose of projecting and exposing patterns of 0.1 μm or less have been proposed. In these optical systems, only an out-of-axis circular-arc-form good-image region is utilized, and only a circular-arc-form region on the mask is projected. Accordingly, the overall pattern of the mask is treated by scanning the mask and the wafer. As a result, a high resolution can be obtained at a relatively high throughput. In order to utilize such an optical system, the circular-arc-form region on the mask must be efficiently illuminated. An illumination optical system of the type shown in FIG. 7 has been proposed as an illumination optical system that satisfies this condition (for example, see Japanese Patent Publication No. 11-312638.

In the proposed illumination system, illumination suitable for the above-mentioned lithography optical system is achieved by means of two fly-eye mirrors 2-a and 2-b. FIGS. 8(a) and 8(b) shows schematic diagrams of these fly-eye mirrors. As is shown in FIGS. 8(a) and 8(b), the first mirror 2-a is constructed from an aggregate of small mirrors that have a circular arc shape. The second mirror 2-b is constructed from an aggregate of small mirrors that have a rectangular shape that is close to square. The optical axes of these mirrors are matched as a result of the respective mirrors being eccentric.

The reason for constructing the illumination optical system as described above is that the light source cannot be viewed as a perfect point light source because the light source has a certain size that must be taken into account. By using such a construction, it is possible to achieve efficient illumination by means of soft X-rays.

In an LPX, the size of the light source is the same as the size of the plasma. If the region in which the material constituting the target is present is larger than the region irradiated by the exciting laser light, the size of the above-mentioned plasma is more or less equal to the size of the irradiated region. Then, the size of the plasma can be varied by changing the size of the irradiated region.

Furthermore, the wavelength distribution of the electromagnetic waves radiated from the plasma are closely connected with the temperature of the plasma that is produced. As the temperature of the plasma increases, shorter-wavelength electro magnetic waves (visible light, ultraviolet light, soft X-rays) are radiated. Accordingly, even in cases where a plasma is generated by means of pulsed light with the same pulse duration time and the same energy, the size of the plasma and the wavelength of the radiated soft X-rays will differ if the focusing diameter differs. Thus, a plasma generated by focusing pulsed laser light in a small region will be smaller than a plasma generated by focusing light in a large region, and will have a higher temperature. Consequently, the spectrum of the electromagnetic waves that are radiated will be shifted toward shorter wavelengths. For example, considering the case of black-body radiation, the peak of the radiation spectrum will be at a wavelength of approximately 13 nm when the temperature of the black body is approximately 30 eV. At higher temperatures, the peak will shift toward shorter wavelengths. In actuality, the soft X-rays radiated by the plasma depend on the electron structure of the material constituting the target, so that soft X-rays with an energy corresponding to the electron transitions are radiated. Consequently, soft X-rays corresponding to energy transitions that are close to the wavelength at which the radiation efficiency is high at the temperature in question are strongly radiated.

Currently, the outputs of laser light sources used for the excitation of a laser plasma are being discussed from the standpoint of the efficiency of conversion to soft X-rays in the principally utilized wavelength region. As an example, a soft X-ray output of 30 W may be considered necessary in order to cause the radiation of soft X-rays in the wavelength region utilized. In cases where this soft X-ray output is to be obtained from a laser plasma, the efficiency of conversion to soft X-rays radiated in a hemispherical solid-angular space (2 πsr) when a certain target is used is 1%. In a case where the soft X-rays in a region equal to ½ of this hemispherical solid angle (among the soft X-rays generated from the plasma) are to be input into the illumination optical system, it is considered that an output of 6 kW is required in the laser light source used for excitation.

However, in cases where a laser plasma is actually used as a light source in soft X-ray lithography, there are various limitations on the conditions of plasma generation. Accordingly, it is not always possible to discuss the problem in terms of conversion efficiency and output of the laser light source alone.

The first limitation is a limitation concerning the size of the plasma generated in a case where the illumination of the mask is taken into account. Since the solid angle through which light is input into the projection optical system is limited as seen from the mask, illuminating light from directions that exceed a solid angle of illumination matching the above-mentioned solid angle is wasted illuminating light. For this reason, it is required that the solid angle of illumination of the mask more or less coincides with the solid angle of input of the projection optical system.

In an optical system, the value of "size of illuminated region×illumination NA" is conserved. Accordingly, in cases where the solid angle is stipulated, it becomes impossible in principle to use all of the light emitted from the light source for illumination if the light source exceeds a certain size. Consequently, in order to realize efficient illumination, it is desirable that the light source be limited to a certain size.

Furthermore, in the case of scanning exposure using an optical system of the type shown in FIG. 7, the illuminated region has a long, thin shape oriented in the direction perpendicular to the scanning direction. Accordingly, the permissible size of the light source differs according to direction, so that a light source that is small in the scanning direction is generally required.

In an optical system of the type shown in FIG. 7, if illumination is performed at a slit width of 1.5 mm and an illumination NA of 0.06, the light source may be viewed as being substantially a point light source as long as the diameter of the light source is smaller than about 50 μm. As a result, the above-mentioned advantages of the fly-eye mirrors are obtained.

Secondly, there is a limitation imposed by the output of the exciting laser light source and the laser light irradiation intensity at which the maximum conversion efficiency is obtained. In order to obtain the utilized soft X-rays at a high conversion efficiency, it is desirable to generate a plasma which has a temperature at which the soft X-rays of that wavelength are efficiently radiated. For this purpose, irradiation of the target at the optimal irradiation intensity per unit area is necessary. Accordingly, in cases where the output per pulse of the exciting laser light has a certain energy, the irradiation area for achieving the optimal irradiation intensity is determined. In cases where this irradiation area is large, the area is substantially equal to the diameter of the plasma that is produced.

Because of these two limitations, the most efficient utilization of soft X-rays of the desired wavelength cannot always be achieved in cases where a single pulsed laser light source with a large output such as a conventional solid laser or excimer laser is used as the laser light source that excites the plasma used as a soft X-ray source in a soft X-ray lithography apparatus.

When a laser plasma is generated, the laser light source used for excitation is oscillated at the maximum output in order to maximize the quantity of soft X-rays obtained. When this maximum output is obtained, the pulsed energy and repetition rate are more or less fixed at certain values in a solid laser or excimer laser. As a result, under conditions other than these fixed values, the time-averaged output of the laser drops. Since the energy per pulse is regulated under the conditions that produce this maximum output, the irradiation area cannot be freely selected even in cases where it is desired to perform irradiation at an irradiation intensity per unit area that is suitable for generating a plasma of the desired temperature. Since the irradiation area more or less coincides with the size of the plasma, the size of the light source cannot be freely selected. In cases where the size of the plasma exceeds the size of the light source suitable for illumination, either the irradiation intensity must be increased while sacrificing optimization of the conversion efficiency, or else the irradiation area must be increased while sacrificing efficient utilization of the generated soft X-rays in illumination.

Furthermore, in order to optimize the efficiency of conversion to soft X-rays in the desired wavelength region, it is necessary to effect a relative decrease in the quantity of X-rays of other wavelengths that are radiated. These soft X-rays are absorbed by a reflective mirror, etc., and converted into heat, thus causing thermal deformation of the reflective mirror. There is a danger that such deformation of the reflective mirror will cause a drop in the treatment speed of the apparatus as a whole; accordingly, it is desirable that soft X-rays of a wavelength not utilized be minimized.

SUMMARY OF THE INVENTION

An object of the present invention is to provide a soft X-ray generating apparatus that obtains a large quantity of soft X-rays, and a soft X-ray lithography apparatus using this soft X-ray generating apparatus.

Another object of the present invention is to obtain an X-ray generating apparatus which can efficiently generate soft X-rays of a desired wavelength.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a soft X-ray generating apparatus comprises a vessel, a target within the vessel, a fiber optic light source for irradiating the target within the vessel, the fiber optic light source providing a plurality of exciting energy beams for irradiating the target to generate a plasma for radiating soft X-rays, the fiber optic light source for irradiating substantially the same position of the target with each of the exciting energy beams.

In a further aspect, the present invention contemplates a soft X-ray generating apparatus comprising a vessel, a target within the vessel, and a plurality of pulsed laser light sources for irradiating the target within the vessel, the pulsed laser light sources providing a plurality of exciting energy beams for irradiating the target to generate a plasma for radiating soft X-rays, each of the laser light sources being controllable to cause the plasma generated as a result of irradiation of the target to have an electron temperature in the range of approximately 20 eV to approximately 100 eV.

The present invention further encompasses a method for generating soft X-rays comprising the steps of providing a target within a vacuum vessel, providing a plurality of sources of laser light, and irradiating the target with laser light from the sources to generate a plasma that radiates soft X-rays, the step of irradiating including the step of individually controlling the laser light sources to set the temperature of the plasma in the range of approximately 20 eV to approximately 100 eV.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF PREFERRED EMBODIMENT

Figure 1:
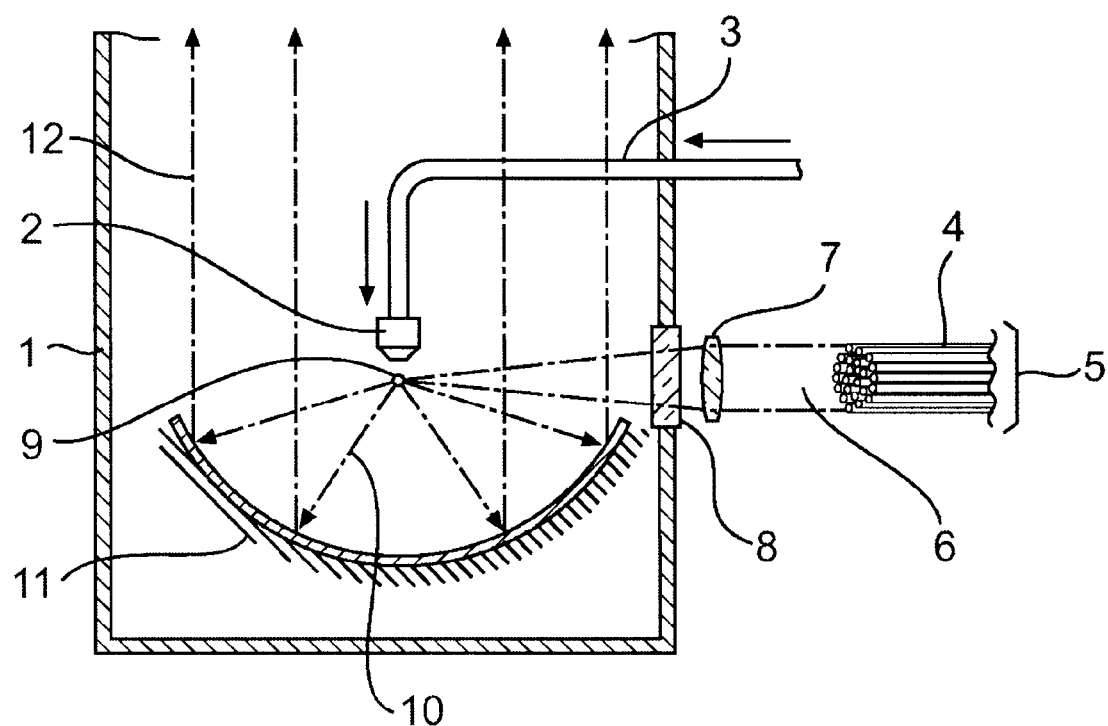
FIG. 1 illustrates a first embodiment of a soft X-ray generating apparatus of the present invention.

It is to be understood that both the foregoing general description and the following detailed description are exemplary and explanatory and are intended to provide further explanation of the invention as claimed.

Reference will now be made in detail to the preferred embodiments of the present invention, examples of which are illustrated in the accompanying drawings. In accordance with the present invention, a soft X-ray generating apparatus includes a target material supplied to the interior of a vessel in which the pressure can be reduced by an evacuation apparatus. The target material is irradiated by an exciting energy beam so that the target material is converted into a plasma to cause soft X-rays to radiate from this plasma. The soft X-ray light source device includes a plurality of fiber lasers or fiber amplifiers as the source of the exciting energy beam. Substantially the same position on the target material is irradiated by the light emitted from this plurality of optical fibers so that a plasma is generated. The term "substantially the same position" refers to the fact that some error is permitted in the design specifications of the apparatus. The term also includes cases in which the position in question is absolutely the same position.

Fiber amplifiers include erbium (Er) or ytterbium (Yb) added to an optical fiber as a dopant that is excited by a laser diode so that light passing through the optical fiber is amplified. If gratings or mirrors are installed on both ends of this optical fiber, the optical fiber is given the structure of a resonator and the resulting device acts as a fiber laser. The diameter of the optical fiber, including the core and the cladding, may be several hundred microns. In the case where the optical fiber is doped with ytterbium, light with a wavelength of 1.03 $\mu$m is obtained. Devices with an energy per pulse of 0.5 mJ, a pulse duration time of approximately 25 ns, and a repetition frequency of approximately 20 kHz have already been manufactured. The optical fibers may be single-mode fibers or multi-mode fibers. The output of a single-mode optical fiber can be focused on an extremely small region near the diffraction limit. If a multi-mode optical fiber with a core diameter of approximately 100 $\mu$m is used, a peak output higher than that of a single-mode optical fiber can be obtained and focusing is possible down to a size comparable to the core diameter.

In the present invention, an assembly formed by bundling a plurality of fiber amplifier or fiber laser output terminals may be used as an exciting light source. Although a light source using a single fiber amplifier has a small output when used alone, a large output can easily be obtained by bundling a plurality of these fiber amplifiers. For example, if 100 fiber-amplifier optical fibers with an output of 10 W (which are already being manufactured) are bundled together, an output of 1 kW can be obtained. Even in this case, the overall thickness of the bundled optical fibers is extremely small, i. e., on the order of several millimeters.

The time at which light is emitted from the respective optical fibers can be varied for each individual optical fiber or for several optical fibers as a group. The heating of the plasma can be efficiently performed by adjusting the time at which light is emitted from each optical fiber, so that a larger quantity of soft X-rays can be obtained. In the case of laser plasma X-ray sources, it has been reported that the efficiency of conversion to soft X-rays is improved by the formation of a pre-plasma. For example, among 100 optical fibers, if the output of 10 of the optical fibers is caused to be emitted approximately 10 ns earlier than the output of the other 90 optical fibers, a pre-plasma is produced by the pulses emitted in advance. This plasma has a lower temperature than the plasma produced in a case where the outputs of all 100 optical fibers are focused at one time; however, this plasma is additionally heated by the pulsed light with which it is subsequently irradiated. In cases where the target material is a metal, etc., if the plasma is excited by a single pulse which has a large energy, this may be inefficient with respect to the heating of the plasma, depending on the conditions, i. e., a portion of the first half of the pulse is lost as a result of surface reflection, etc. The heating of the plasma can be performed more effectively by forming a pre-plasma.

If the irradiating pulses are provided as a pulse train, it is also possible to form a plasma that has the desired high soft X-ray generation efficiency. The spectrum of the soft X-rays radiated from the plasma depends on the temperature of the plasma. As the temperature of the plasma increases, the X-rays are shifted toward shorter wavelengths. Accordingly, even if the plasma is efficiently heated by utilizing a pre-plasma, the temperature of the plasma will be too high in cases where the energy of the main pulse is excessive. As a result, there is a danger that the efficiency of conversion to soft X-rays of the desired wavelength will drop. In this case, if the temperature of the plasma is lowered by converting the main pulse into a pulse train so that the heating of the plasma does not occur all at once, a plasma with a temperature at which the efficiency of conversion into soft X-rays of the desired wavelength is high can be produced.

Micro-lenses, which convert the emitted light into substantially parallel light, may be installed on the emission surfaces of the respective optical fibers. In this way, since the emitted light is converted into parallel light by installing micro-lenses on the emission surfaces of the respective optical fibers, all of the emitted light may be focused at the same point for the purpose of producing the plasma. The micro-lenses, which convert the emitted light into convergent light, are installed on the emission surfaces of the respective optical fibers. Accordingly, the emitted light can be focused and directed onto the target material even without using other optical elements. Also, at least some of the optical axes of the light emitted from the respective optical fibers may be caused to be substantially parallel to each other. When the emitted light from some or all of the optical fibers is converted into substantially parallel light with substantially parallel optical axes, the emitted light may be easily focused at the same point by means of a lens, etc.

The optical fibers may be arranged so that the optical axes of the light emitted from the respective optical fibers all pass through substantially the same point. A plasma can be generated by the light emitted from the respective optical fibers without using any optical elements. In cases where the emitted light is convergent light, focusing of the emitted light can be realized by arranging the emission surfaces of the respective optical fibers so that the focal points of the optical fibers are substantially coincident. Furthermore, the respective optical fibers have a clad diameter of several hundred microns; accordingly, even in cases where the emitted light is converted to parallel light by the micro-lenses, the output light of all of the optical fibers will be concentrated in a region having a diameter of several hundred microns if the optical fibers are arranged so that the optical axes of the emitted light pass through the same point. This makes it possible to obtain the energy density required for plasma production. Furthermore, the angular distribution of the intensity of the X-rays generated can be controlled by irradiating the target material from multiple directions with light emitted from a plurality of optical fibers or optical fiber groups.

Embodiments of the present invention will be described below with reference to the drawing Figures. FIG. 1 shows a first embodiment of a soft X-ray generating apparatus according to the present invention. In FIG. 1, a vacuum vessel 1 has a nozzle 2 therein. The nozzle 2 is positioned at the end of a gas introduction pipe. Optical fibers 4 constitutes the output terminals of fiber amplifiers and are provided as an optical fiber group 5. Laser pulse 6 emitted from the optical fibers passes through a lens 7 and an exciting laser light introduction window 8. A plasma 9 is formed and soft X-rays 10 are generated. A rotating multi-layer coat parabolic mirror 11 the soft X-rays 10 as parallel beams 12 of soft X-rays.

The nozzle 2, which jets krypton (Kr) gas, is installed inside the vacuum vessel 1, and is supplied with high-pressure krypton gas from the gas introduction pipe 3. The present apparatus has an optical fiber group 5 formed by bundling together 100 optical fibers 4 constituting the output terminals of fiber amplifiers. The laser pulse 6 emitted from these optical fibers 4 passes through the lens 7 and the exciting laser light introduction window 8, and is focused on the krypton gas jetting from the tip end of the nozzle 2. As a result, the krypton gas is excited so that a plasma 9 is produced, and soft X-rays 10 are emitted from the plasma 9. The soft X-rays 10 are reflected by the rotating multi-layer coat parabolic mirror 11, and are emitted to the outside as parallel beams 12 of soft X-rays.

The light emitted from the respective optical fibers 4 may be converted into substantially parallel light by means of micro-lenses attached to the respective emission end surfaces. Accordingly, the light 6 emitted by the optical fiber group 5 as a whole can be focused at the same point by a single lens 7. For example, the light may be focused at a position located 1 mm from the tip end of the nozzle 2. During the generation of the plasma 9, krypton gas continuously jets from the nozzle 2. However, the interior of the vacuum vessel 1 is subjected to an exhaust action at a sufficient exhaust rate by means of an exhaust apparatus (not shown in the Figures), so that a sufficient transmissivity with respect to soft X-rays can be obtained.

In the present soft X-ray generating apparatus, an energy of 6 kW is supplied to the plasma by the exciting energy beam. 1% of this energy is converted into soft X-rays having a wavelength of 13 nm (2.5% BW) so that 60 W of soft X-rays (wavelength: 13 nm, 2.5% BW) are generated. The solid angle of the rotating multi-layer coat parabolic mirror 11, as seen from the plasma 9, is $\pi$ steradians (¼ of the total solid angle), and the reflectivity of the rotating multi-layer coat parabolic mirror 11 is 65%; consequently, approximately 10 W of soft X-rays can be extracted as a soft X-ray parallel beam 12.

The present invention concerns a soft X-ray generating apparatus equipped with a plurality of laser light sources that emit pulsed laser light. The laser light is focused on a target inside a vessel under reduced pressure, so that the material constituting this target is converted into a plasma. The laser light sources can be controlled by a control mechanism and caused to irradiate the target so that the electron temperature of the plasma is approximately 20 eV to 100 eV. The present invention provides the irradiation timing of each of the laser light sources may be adjusted so that the number of laser light sources is controlled. The control includes adjusting the energy intensity of the pulsed laser light of each of the above-mentioned laser light sources. The irradiation intensity of the pulsed laser light that irradiates the target may be in the order of $10^{10}$~$10^{11}$ W/cm$^2$ and each of the plurality of laser light sources may be separately controlled, so that the electron temperature of the plasma that is generated is approximately 20 eV to 100 eV.

Figure 2:
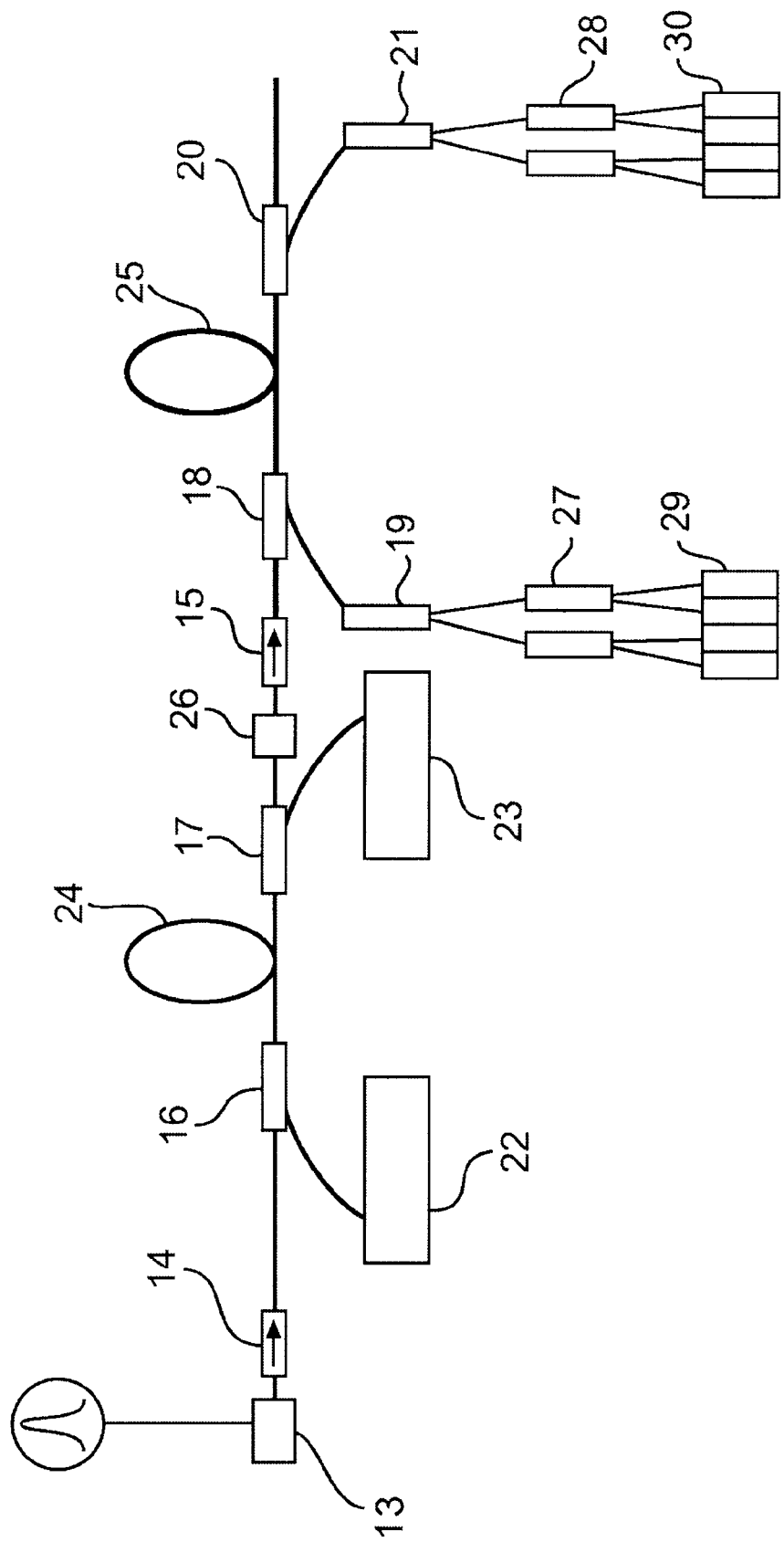
FIG. 2 illustrates a fiber amplifier for use in a soft X-ray generating apparatus according to the present invention.

FIG. 2 shows an example of the construction of the fiber amplifiers. In FIG. 2, a laser diode 13 is provided adjacent an isolator 14. Wavelength division multiplexers 16–21 and exciting laser diodes 22 and 23 are provided. Doped optical fibers 24 and 25 are provided as is a filter 26 and an isolator 15. Polarized wave front synthesizers 27 and 28 and exciting laser diodes 29 and 30 complete the amplifier.

Exciting light from the exciting laser diodes 22 and 23 is introduced into the doped optical fiber 24 via the wavelength division multiplexers 16 and 17, and the input signal light is subjected to wave synthesis with the exciting laser diodes 22 and 23 so that the first doped optical fiber 24, which may be doped with erbium or ytterbium, is excited. The laser light emitted from the laser diode 13 is transmitted to the doped optical fiber 24 via the isolator 14 and wavelength division multiplexer 16, and is amplified. The amplified light is conducted to the wavelength division multiplexer 17, and is further conducted to the second-stage light amplifier via the filter 26 and isolator 15.

In the second-stage light amplifier, excited light from the exciting laser diodes 29 and 30 is introduced into the wavelength division multiplexers 18 and 20 via the polarization combiner 27 and 28, which combine the orthogonally polarized light outputs from the laser diodes, and the wavelength division multiplexers 19 and 21. This light is conducted to the second doped optical fiber 25, which may be doped with erbium or ytterbium, so that the doped optical fiber 25 is excited. The light from the isolator 15 is amplified as a result of passing through the doped optical fiber 25. The amplified light is output to the outside via the wavelength division multiplexer 20. A plurality of exciting laser diodes 29 and 30, for example, four laser diodes are provided on the entry side and exit side of the second doped optical fiber 25 in the second-stage light amplifier to increase the intensity of the exciting light.

Thus, in the fiber amplifier shown in FIG. 2, laser light from the laser diode 13 is amplified by the doped optical fibers 24 and 25 in two stages so that the output light obtained for each optical fiber has an energy of 1 mJ/shot, a pulse duration time of 5 ns, and a repetition frequency of 60 Hz. Since the output of such a fiber amplifier is 60 W, if such an output is outputted from each of the optical fibers 4 shown in FIG. 1, the optical fiber group 5 will have a mean output of 6 kW.

Figure 3:
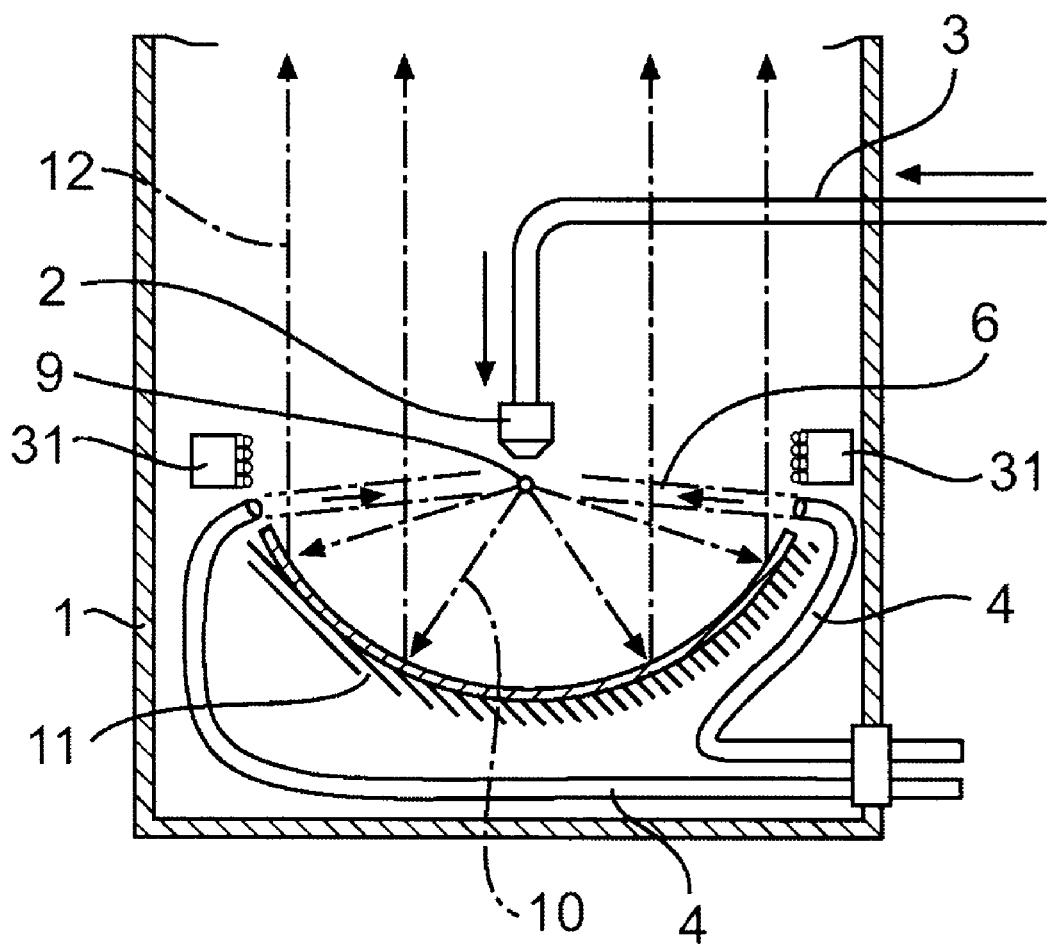
FIG. 3 illustrates a second embodiment of a soft X-ray generating apparatus according to the present invention.

FIG. 3 shows a soft X-ray generating apparatus according to a second embodiment of the present invention. In FIG. 3 and the following figures, elements that are the same as elements described in connection with FIGS. 1 and 2 are labeled with the same reference numerals and symbols, and descriptions of these common elements are omitted.

In the apparatus shown in FIG. 3, the nozzle 2 jets krypton (Kr) gas into the vacuum vessel 1. High-pressure krypton gas is supplied through the gas introduction pipe 3. In this apparatus as well, one hundred optical fibers 4 are provided which are the output ends of fiber amplifiers. Micro-lenses are attached to the emission end surfaces of the optical fibers 4, so that the light beams emitted from the optical fibers 4 are parallel light beams with a diameter of approximately 0.1 mm. However, instead of being bundled into a single body, the respective optical fibers 4 are installed so that they surround the nozzle 2 from which the krypton gas is caused to jet.

The optical axes of the laser pulse 6 emitted from each of the optical fibers 4 intersect at a position located approximately 1 mm from the nozzle 2. If pulsed light is emitted from all 100 optical fibers 4 at the same instant, all of the emitted light is concentrated at this position. The region where the emitted light is concentrated is a spherical region with a diameter of approximately 0.1 mm. Plasma 9 is generated in this region, and soft X-rays 10 are radiated. The soft X-rays are reflected by the rotating multi-layer film parabolic mirror 11, and are emitted to the outside as a soft X-ray parallel beam 12. In the present working configuration, as in the first working configuration, approximately 10 W of utilized X-rays (wavelength: 13 nm, 2.5% BW) are generated.

Since the plasma is excited by the exciting laser beams being directed from multiple directions, a highly symmetrical plasma 9 is generated. Accordingly, the angular distribution of the radiated X-rays is also highly symmetrical. As a result, the soft X-ray parallel beam 12 formed by radiation from the rotating multi-layer film parabolic mirror 11 has an axially symmetrical intensity distribution.

The intensity of the soft X-rays radiated from the plasma 9 may be detected by numerous soft X-ray detectors 31. Since the angular distribution of the intensity of the soft X-rays radiated from the plasma has an inclination with a peak in the direction of irradiation of the exciting laser beam. Symmetry of the plasma can be restored in cases where the intensity of the soft X-rays drops in a certain direction by raising the irradiation intensity of the exciting laser from that direction. As a result, the axial symmetry of the parallel beam can be maintained. Such a parallel beam can be appropriately used to irradiate the mask via an illumination optical system in soft X-ray lithography.

Figure 4:
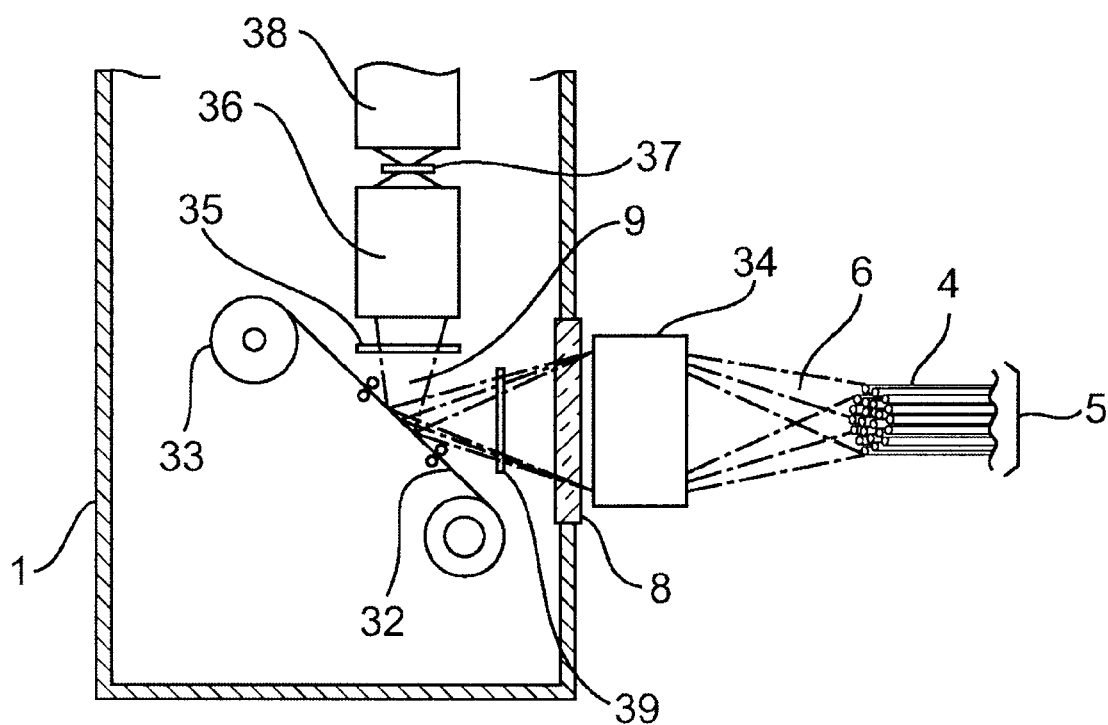
FIG. 4 illustrates a third embodiment of a soft X-ray generating apparatus according to the present invention.

FIG. 4 shows a soft X-ray generating apparatus according to a third embodiment of the present invention. This embodiment may be used as the light source part of an X-ray microscope. In FIG. 4, a tantalum foil, 32 is unwound from a reel 33. A reduction optical system 34, X-ray filter 35, illumination optical system 36, enlarging and imaging optical system 38, and a laser light transmitting plate 39 used to block debris are provided in this embodiment. A sample 37 is also represented.

A tape-form tantalum foil 32 with a thickness of about 15 $\mu$m is installed inside the vacuum vessel 1 and is used as a target material. Laser pulse 6 emitted from an optical fiber group 5 formed by bundling together 100 optical fibers constituting the output ends of fiber amplifiers is directed onto the surface of the tantalum foil 32 by means of the reduction optical system 34. The reduction optical system 34 reduces the image at the position of the emission end surface of the optical fiber group to 1/10th of the original size, and projects this image onto the tantalum foil. The respective optical fibers 4 may have lenses on their end surfaces that convert the emitted light into parallel light. In all other respects, these optical fibers are similar to the optical fibers 4 indicated in the first and second working configurations. The peak intensity of the laser light per unit area of the emitted light at the positions of the emission end surfaces is $10^8$ to $10^9$ W/cm$^2$; this intensity reaches a value of $10^{11}$ to $10^{11}$ W/cm$^2$ at the surface of the target material, so that a plasma 9 is generated.

Since holes are formed in the tantalum foil 32 as a result of the generation of the plasma 9, a reel 33 is rotated during the generation of the soft X-rays, so that a new portion of the tantalum foil 32 is constantly irradiated by the laser pulse 6 emitted from the optical fibers. In the present embodiment, single-mode fiber amplifiers are used; accordingly, this embodiment is suitable for focusing the emitted light onto an extremely small region.

The soft X-rays thus generated pass through the X-ray filter 35, which may comprise a thin film of titanium (Ti), and enter the illumination optical system 36. The image of the sample 37 illuminated by the illumination optical system 36 is enlarged and observed by means of the enlarging and imaging optical system 38.

Furthermore, in the present apparatus, a laser light transmitting plate 39 is provided to block debris emitted from the plasma. This member 39 prevents stray matter generated as a result of the nozzle 2, etc., being abraded by the plasma from adhering to the exciting laser light introduction window 8.

In the present X-ray microscope apparatus, critical illumination is used as the sample illumination method, so that the intensity distribution of the plasma 9 constituting the light source is reflected "as is" in the illumination intensity distribution of the sample 37. If a plasma is generated by a single pulse which has a large energy (up to several hundred mJ), the central portion of the plasma image will be strongly illuminated, and the peripheral portions will be weakly illuminated, so that it is difficult to obtain a uniform illumination intensity. The optical fiber group 5 may be formed by bundling together 100 optical fibers, in which each fiber has a diameter of 0.2 mm. As a result, the overall diameter of the optical fiber group 5 is approximately 2 mm. Accordingly, 100 plasmas with a diameter of approximately 20 $\mu$m are generated on the tantalum foil in a region with a diameter of approximately 0.2 mm. If numerous small plasmas are thus formed in a certain region, an illumination that is uniform overall can be obtained. Furthermore, in observation by means of an X-ray microscope, if an attempt is made to observe samples with greatly different optical densities in the same visual field, there is a danger that a difference will occur in the optimal illumination intensity within the visual field. In embodiment, however, an illumination intensity distribution that is optimal for observation can be formed within the visual field by adjusting the outputs of the respective optical fibers.

Figure 6:
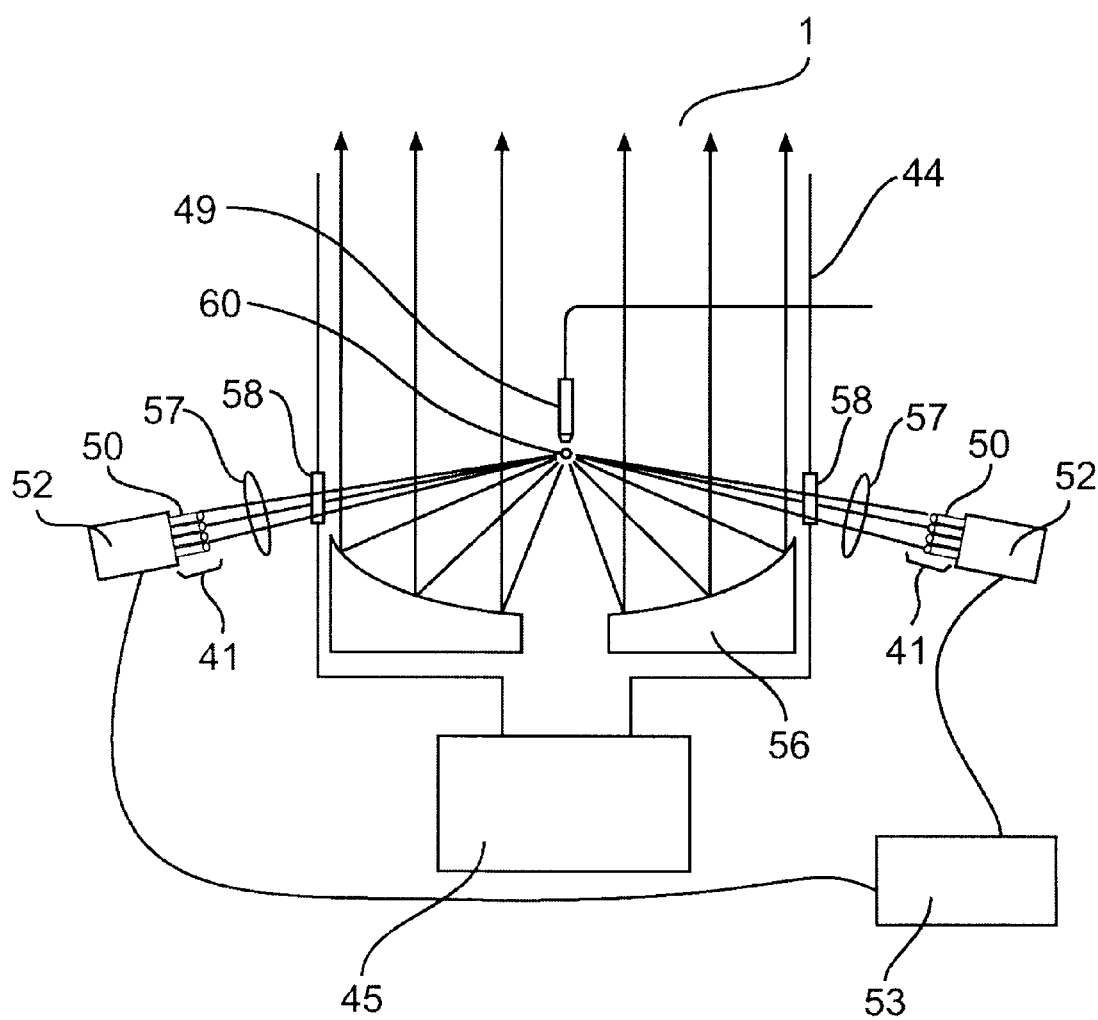
FIG. 6 illustrates a fourth embodiment of a soft X-Ray generating apparatus according to the present invention.

FIG. 6 shows another embodiment of the soft X-ray generating apparatus of the present invention wherein a parallel soft X-ray beam generating part constitutes the illumination optical system of a soft X-ray lithography apparatus. A nozzle 49, which jets krypton (Kr) gas constituting a target, is installed inside a vacuum vessel 44 which is evacuated to a pressure of 1 Torr or less by means of an exhaust apparatus 45. A light source includes, for example, a total of 100 fiber amplifiers in a single light source. Furthermore, these 100 fiber amplifiers form 10 fiber groups 41, each of which has 10 fiber amplifiers bundled together. These fiber groups 41 are installed to surround the axis of the nozzle 49. FIG. 6 shows the apparatus equipped with two fiber groups 41.

The krypton gas that jets from the nozzle 49 is rapidly cooled by adiabatic expansion, and therefore condenses to form clusters. A plasma 60 is generated by irradiating these clusters with laser light from the fiber amplifiers 50. Soft X-rays are radiated from this plasma 60.

The fiber amplifiers 50 have a core diameter of 50 $\mu$m, and oscillate in a multi-mode. The output light energy per fiber is 1 mJ/shot, the pulse duration time is 5 ns, and the repetition frequency is 60 kHz. Accordingly, fiber groups 41 consisting of 100 fibers have an average output of 6 kW.

In the fiber groups 41, the laser light emitted from the respective fiber amplifiers 50 is converted into parallel light for each fiber group by micro-lenses attached to the respective emission end surfaces. Furthermore, the resulting parallel light is focused on the gas jetting from the nozzle 49. The region in which the light is focused has a diameter of 50 $\mu$m.

The timing of the oscillation of the individual fiber amplifiers 50 within the respective fiber groups 41 is staggered; however, the respective fiber groups 41 are controlled by control devices 52 and 53 so that they oscillate with the same timing. In the present embodiment, the control device 52 controls the respective fiber amplifiers 50, and the control device 53 controls the respective fiber groups 41. Accordingly, the target krypton gas is subjected to an irradiation which is the same as an irradiation by 10 mJ of pulsed light at a repetition frequency of 600 kHz. The irradiation intensity in this case is approximately $10^{11}$ W/cm$^2$; as a result, a plasma with an electron temperature of approximately 30 eV is formed. The control devices 52 and 53 can control the duration, amplitude, and frequency of laser light pulses from the fiber groups 41 and amplifiers 50.

Furthermore, the region irradiated by the exciting laser light has a diameter of 50 μm; accordingly, the size of the plasma 60 is roughly equal to this diameter. Furthermore, the soft X-rays radiated from the plasma 60 are reflected by a rotating parabolic mirror 56 on whose surface a multi-layer film which has a high reflectivity with respect to soft X-rays having a wavelength of 13 nm is formed, and the resulting reflected X-rays form a parallel beams of soft X-rays.

In the present embodiment, a plasma with a diameter of 50 μm and an electron temperature of approximately 30 eV can be efficiently generated by the exciting light source with an output of 6 kW. Furthermore, since this plasma has a diameter of 50 μm, illumination which is suitable for efficient reduction and projection by means of fly-eye mirrors with easily manufactured shapes can be realized in cases where an illumination optical system of the type shown in FIG. 2 is used.

Furthermore, a plasma with an electron temperature of approximately 30 eV has a high radiation efficiency for soft X-rays with a wavelength of 13 nm; accordingly, soft X-rays in this region can be efficiently radiated. In addition, since the radiation efficiency for wavelengths other than the wavelength utilized in projection exposure is low, the thermal burden on the parabolic mirror 16, etc., can be reduced.

In the above embodiments, fiber amplifiers constructed as shown in FIG. 2 are used; however, it would also be possible to use fiber lasers in which a resonator structure is formed by installing mirrors or gratings at both ends of the optical fibers.

In the first and second embodiments, the soft X-rays radiated from the plasma are converted into a parallel beam by a rotating parabolic mirror. However, it is also possible to form a converging or diverging beam according to the construction of the illumination optical system of the soft X-ray reduction and projection type exposure apparatus.

Figure 5:
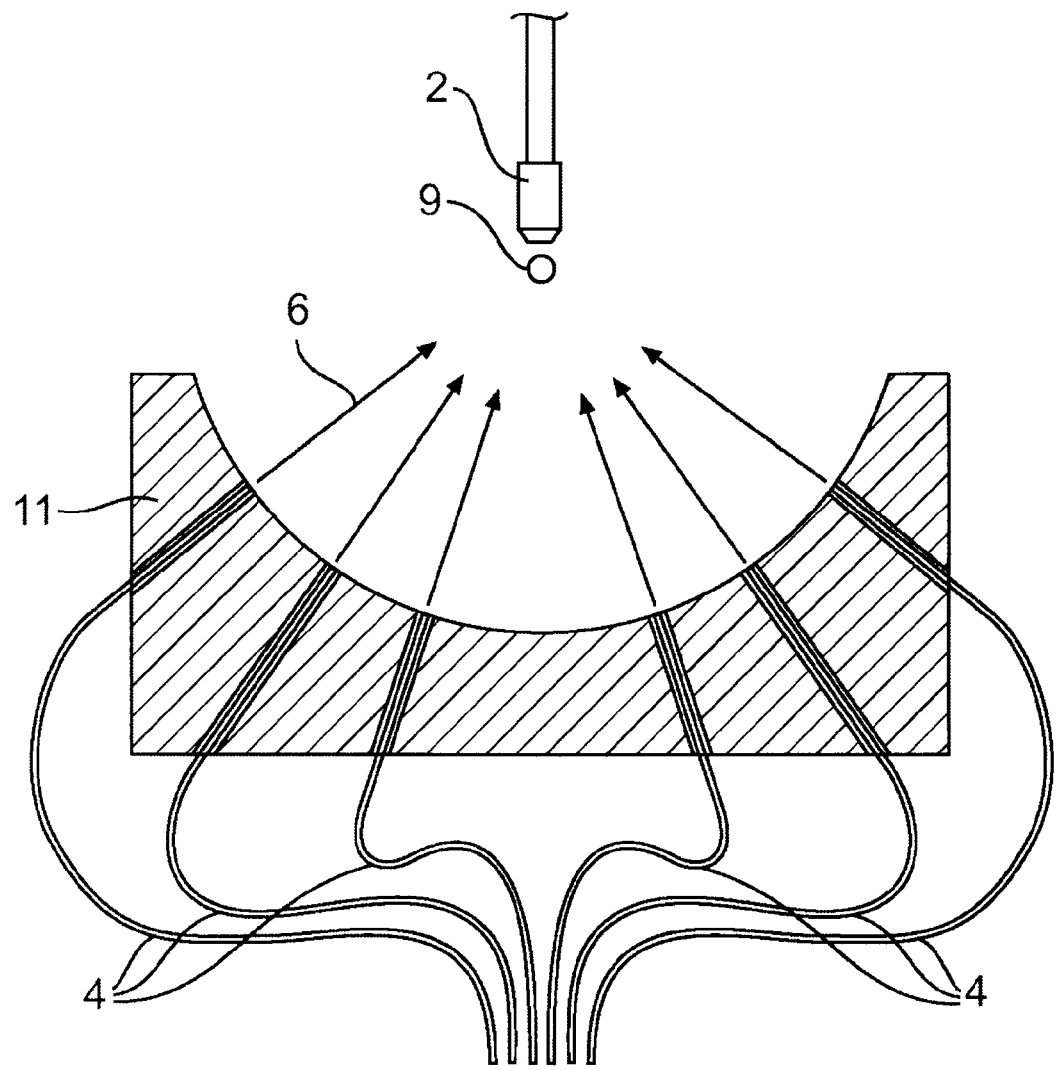
FIG. 5 illustrates the relationship between a rotating parabolic mirror and the optical fibers is a soft X-ray generating apparatus of the present invention.

In the second embodiment, the optical fibers 4 are installed on the outside of the rotating parabolic mirror; however, since the optical fibers 4 are extremely fine, it would also be possible to form fine holes with a diameter of 1 nmm or less in the rotating multi-layer film parabolic mirror 11 as shown in FIG. 5, and to pass the optical fibers 4 (which are the output terminals of fiber amplifiers) through these holes, so that the light 6 emitted from the optical fibers 4 is caused to irradiate the same point.

Furthermore, in the above embodiments, the light emitted from all of the optical fibers is simultaneously concentrated at the same point. However, it is also possible to vary the timing of light emission from the respective optical fibers, either on a fiber-by-fiber basis, or on the basis of groups consisting of several optical fibers. As a result, a pre-plasma can be generated by irradiation with a small amount of exciting light. A plasma can then be generated by irradiating the pre-plasma with a large amount of exciting light so that the pre-plasma is subjected to follow-up heating, to provide efficient plasma generation. Furthermore, by forming the exciting light into a pulse train, the temperature of the plasma can be adjusted, so that a plasma with a temperature at which the efficiency of conversion into soft X-rays of the desired wavelength is high can be generated.

Furthermore, in order to stagger the timing of the emission of exciting light from the respective optical fibers, the lengths of the respective optical fibers, can be made to vary so that the time required for the propagation of light through the optical fibers is varied. Alternatively, it would also be possible to use a time division multiplexer as another method of converting the exciting light into a pulse train.

In the present embodiment, furthermore, the pulsed laser light source is constructed from fiber amplifiers or fiber lasers. In such a construction, the oscillation timing can be controlled on a fiber-by-fiber basis or on the basis of fiber groups consisting of several fibers to several tens of fibers; accordingly, this construction is desirable for irradiation control. Furthermore, if the device is controlled so that the pulsed light emitted from the fiber amplifiers or fiber lasers is single-mode light, the emitted light can be focused on an extremely small region. Accordingly, the focusing diameter of the laser light can be made smaller, so that the diameter of the plasma that is generated can be reduced.

In the present invention, fiber amplifiers are used as an exciting pulsed laser light source; however, light sources which can be used are not limited to such a light source. Pulsed laser light sources that can be used in the present invention include light sources using a plurality of other pulsed laser light sources, as well as excimer lasers or solid lasers, or fiber lasers in which a resonator structure is formed by installing mirrors or gratings on both ends of the fibers.

Moreover, while krypton gas is caused to jet into a vacuum, and this jetting gas is used as a target, the type of gas used as a target is not limited to krypton. Examples of other gases which can be used include xenon gas and oxygen gas, or compounds or mixtures which contain these gases. Furthermore, the state of the target is not limited to a gaseous state; a solid or liquid target may also be used. In addition, the shape of the target may be some other shape such as a fine linear shape, a thin film shape, a fine particle shape or a liquid droplet shape, etc. However, it is desirable that the shape be such that the irradiating pulsed laser light can be absorbed without waste.

Furthermore, a screening member (not shown in the figures) which is capable of transmitting laser light may be installed between the window 58 (FIG. 6) and the plasma 60 inside the vacuum vessel 44. In this way, contamination of the window 58 by debris accompanying the generation of the plasma can be prevented. Furthermore, if the screening member is made movable, contaminated regions of the screening member can easily be replaced by uncontaminated regions.

Figure 7:
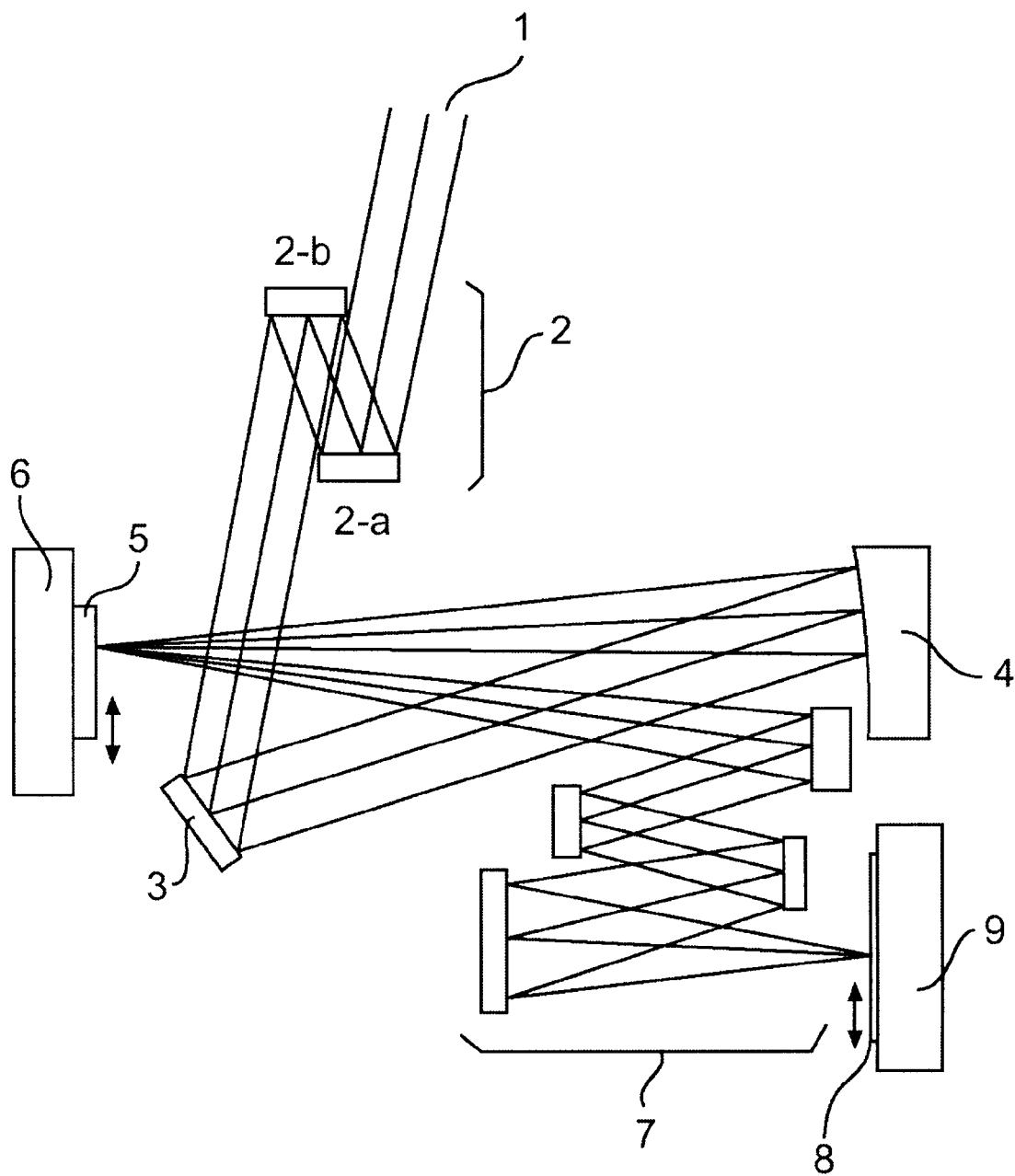
FIG. 7 illustrates an example of illumination by means of soft X-rays, and an example of a reduction and projection type exposure optical system.
Figure 8A:
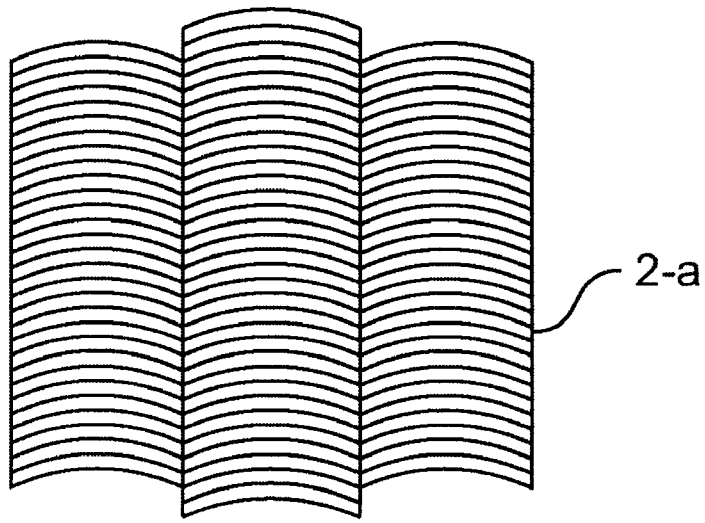
FIGS. 8A and 8B illustrates examples of fly-eye mirrors for use in an illumination optical system using soft X-rays.
Figure 8B:
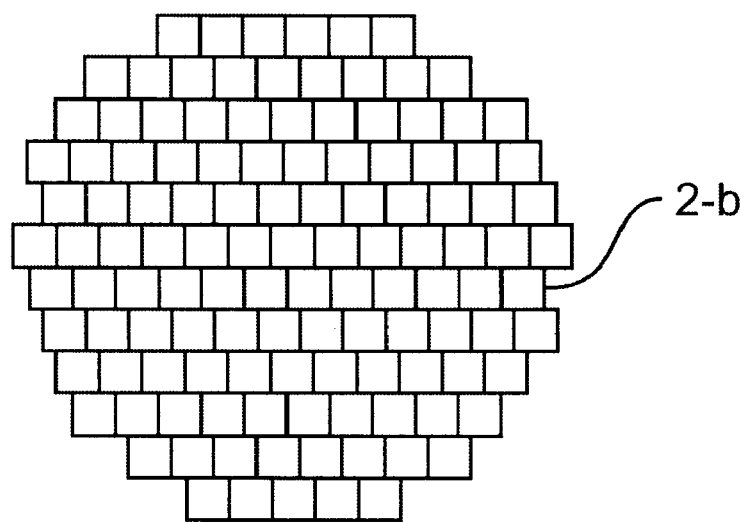

In cases where the apparatus of the present invention is used, the radiation efficiency of soft X-rays in the wavelength region of approximately 10 to 15 nm is high. Accordingly, as a soft X-ray source suitable for use in an optical system of the type shown in FIG. 7, this apparatus allows the efficient generation of a plasma with an electron temperature of about 20 to 100 eV and a diameter of 50 μm. However, in cases where the apparatus of the present invention is used as a soft X-ray generating apparatus in other applications, the plasma is not limited to the above-mentioned temperature or size. A plasma with a temperature and size suited to the application can be generated. Furthermore, the size of the plasma can be controlled to some extent by varying the focusing diameter during pulsed laser light irradiation. Moreover, the temperature of the plasma can be controlled by varying the energy of the pulsed laser light that is emitted at the same time. The energy of this laser light that is emitted at the same time can be controlled by varying the number of fiber amplifiers forming each fiber group, and controlling the irradiation timing for the respective fiber groups; accordingly, plasma excitation can be performed without lowering the overall time-averaged output of the fiber amplifiers.

As a result of the present invention, the conversion efficiency for soft X-rays with a wavelength of around 13 nm is improved in an X-ray generating apparatus which has a plurality of laser light sources. Furthermore, X-rays at wavelengths other than wavelengths in the vicinity of 13 nm can be relatively reduced. Accordingly, mirror damage can be alleviated, so that the drop in performance and deterioration in working efficiency accompanying mirror replacement, as well as cost increases, can be alleviated.

Furthermore, by using the soft X-ray generating apparatus of the present invention to control the irradiation intensity at the time of irradiation with pulsed light to a value of $10^{10}$ to $10^{11}$ W/cm$^2$, it is possible to achieve a further increase in the efficiency of conversion to soft X-rays with a wavelength in the vicinity of 13 nm. Accordingly, in cases where the soft X-ray generating apparatus of the present invention is used in an exposure apparatus, soft X-rays having the wavelength required for exposure can be generated with greater efficiency than in conventional methods; as a result, the time required for exposure can be shortened. Consequently, the exposure treatment capacity of the exposure apparatus can be increased.

Since a plasma with a diameter of 50 μm or less can be generated, there is no need to use difficult-to-manufacture reflective mirrors as in conventional methods. Accordingly, soft X-rays generated using a reflective mirror with an easily manufactured and worked shape can be efficiently used in illumination. Consequently, an X-ray generating apparatus and an exposure apparatus equipped with this X-ray generating apparatus can be manufactured easily and at low cost without any loss of conventional performance. By selecting the pulsed laser light sources that oscillate at the same time, it is possible to vary the energy of the pulsed laser light irradiating the target at the same time without causing a drop in the output of the pulsed laser light source as a whole. As a result, the temperature of the plasma that is thus generated can be selected, so that an easily controllable X-ray apparatus is obtained.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A soft X-ray generating apparatus comprising:
   a vessel;
   a target within the vessel;
   a fiber optic light source for irradiating the target within the vessel, the fiber optic light source providing a plurality of exciting energy beams for irradiating the target to generate a plasma for radiating soft X-rays, the fiber optic light source for irradiating substantially the same position of the target with each of the exciting energy beams.

2. A soft X-ray generating apparatus according to claim 1, wherein the vessel comprises a vacuum chamber.

3. A soft X-ray generating apparatus according to claim 2, wherein the fiber optic light source comprises a plurality of optical fiber lasers for emitting laser light as the exciting energy beams.

4. A soft X-ray generating apparatus according to claim 3, wherein the optical fiber lasers include fibers doped with erbium (Er) or ytterbium (Yb).

5. A soft X-ray generating apparatus according to claim 3, wherein the target comprises a tantalum foil.

6. A soft X-ray generating apparatus according to claim 3, wherein the target comprises a gas from the group consisting of krypton gas, xenon gas, oxygen gas, and a mixture containing krypton, xenon or (and) oxygen.

7. A soft X-ray generating apparatus according to claim 2, wherein the fiber optic light source comprises a plurality of optical fiber amplifiers for emitting light as the exciting energy beams.

8. A soft X-ray generating apparatus according to claim 7, wherein the optical fiber amplifiers include fibers doped with erbium (Er) or ytterbium (Yb).

9. A soft X-ray generating apparatus according to claim 3, wherein each of said optical fiber lasers includes an emissive end, and wherein the apparatus further includes a plurality of light emission optical fibers singly coupled to the emissive ends of the optical fiber lasers.

10. A soft X-ray generating apparatus according to claim 9, wherein the optical axes of the light emitted from at least two of the light emission optical fibers is substantially mutually parallel.

11. A soft X-ray generating apparatus according to claim 9, further including a plurality of micro-lenses singly joined to the plurality of emission optical fibers to convert light emitted from the plurality of optical fiber lasers into substantially parallel light.

12. A soft X-ray generating apparatus according to claim 9, further including a plurality of convergent micro-lenses singly joined to the plurality of emission optical fibers to converge light emitted from the plurality of optical fiber lasers.

13. A soft X-ray generating apparatus according to claim 9, wherein the emission optical fibers are arranged so that the optical axes of the light emitted from the respective emission optical fibers pass through substantially the same point within the vessel.

14. A soft X-ray generating apparatus according to claim 7, wherein each of said optical fiber amplifiers includes an emissive end, and wherein the apparatus further includes a plurality of emission optical fibers singly coupled to the emissive ends of the optical fiber amplifiers.

15. A soft X-ray generating apparatus according to claim 14, wherein the optical axes of the light emitted from at least two of the light emission optical fibers is substantially mutually parallel.

16. A soft X-ray generating apparatus according to claim 14, further including a plurality of micro-lenses singly joined to the plurality of emission optical fibers to convert light emitted from the plurality of optical fiber amplifiers into substantially parallel light.

17. A soft X-ray generating apparatus according to claim 14, further including a plurality of convergent micro-lenses singly joined to the plurality of emission optical fibers to converge light emitted from the plurality of optical fiber lasers.

18. A soft X-ray generating apparatus according to claim 14, wherein the emission optical fibers are arranged so that the optical axes of the light emitted from the respective emission optical fibers pass through substantially the same point within the vessel.

19. A soft X-ray generating apparatus according to claim 7, further including a control unit for controlling the emission of light from the emission optical fibers individually or as a group.

20. A soft X-ray generating apparatus according to claim 3, further including a control for controlling the irradiation timing of operation of each of optical fiber lasers.

21. A soft X-ray generating apparatus according to claim 20, wherein the control adjusts the energy intensity of the laser light from each of optical fiber lasers.

22. A soft X-ray generating apparatus according to claim 20, wherein the control drives the outputs of optical fiber lasers at or near the maximum time-averaged output during the generation of the soft X-rays.

23. A soft X-ray generating apparatus according to claim 20, wherein the control drives optical fiber lasers to irradiate the target with a light intensity in the order of $10^{10} \sim 10^{11}$ W/cm$^2$.

24. A soft X-ray generating apparatus comprising:
a vessel;
a target within the vessel;
a plurality of pulsed laser light sources for irradiating the target within the vessel, the pulsed laser light sources providing a plurality of exciting energy beams for irradiating the target to generate a plasma for radiating soft X-rays, each of the laser light sources being controllable to cause the plasma generated as a result of irradiation of the target to have an electron temperature in the range of approximately 20 eV to approximately 100 eV; and
a control for controlling the irradiation timing of operation of each of the laser light sources,
wherein the pulsed laser light sources include optical fiber amplifiers.

25. A soft X-ray generating apparatus comprising:
a vessel;
a target within the vessel;
a plurality of pulsed laser light sources for irradiating the target within the vessel, the pulsed laser light sources providing a plurality of exciting energy beams for irradiating the target to generate a plasma for radiating soft X-rays, each of the laser light sources being controllable to cause the plasma generated as a result of irradiation of the target to have an electron temperature in the range of approximately 20 eV to approximately 100 eV; and
a control for controlling the irradiation timing of operation of each of the laser light sources,
wherein the pulsed laser light sources include optical fiber lasers.

26. A method for generating soft X-rays comprising the steps of:
providing a target within a vacuum vessel;
providing a plurality of sources of optical fiber lasers; and
irradiating the target with laser light from the sources to generate a plasma that radiates soft X-rays, the step of irradiating including the step of individually controlling optical fiber lasers to set the temperature of the plasma in the range of approximately 20 eV to approximately 100 eV.

27. A method according to claim 26, wherein the step of controlling includes the step of controlling optical fiber lasers to produce pulses of light having selected frequencies and durations.

28. A method according to claim 26, further including the step of focusing the laser light from substantially all of the sources on a single point within the target.

29. A method according to claim 26, wherein the step of irradiating includes the step of irradiating the target at a first energy level to form a pre-plasma and the step of irradiating the target at a second energy level higher than the first energy level to form a plasma.

30. A method according to claim 26, wherein the step of providing a target within a vessel comprises the step of providing a gas from the group consisting of krypton gas, xenon gas, oxygen gas, and a mixture of two or more of krypton gas, xenon gas, and oxygen gas.

31. A method according to claim 26, wherein the step of providing a target within a vessel comprises the step of providing a tantalum foil within the vessel.

* * * * *